(12) United States Patent
Ezz et al.

(10) Patent No.: US 10,992,334 B2
(45) Date of Patent: Apr. 27, 2021

(54) RADIO FREQUENCY SWITCHES WITH CONTROLLABLE RESONANT FREQUENCY

(71) Applicant: Analog Devices International Unlimited Company, Limerick (IE)

(72) Inventors: Amr Reda Saad Ezz, Cairo (EG); Yousri Abozaid Mohamed Ahmed, Cairo (EG)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/815,694

(22) Filed: Mar. 11, 2020

(65) Prior Publication Data

US 2020/0321998 A1  Oct. 8, 2020

Related U.S. Application Data

(60) Provisional application No. 62/829,219, filed on Apr. 4, 2019.

(51) Int. Cl.
*H04B 1/44* (2006.01)
*H01Q 3/30* (2006.01)
(Continued)

(52) U.S. Cl.
CPC .................. *H04B 1/44* (2013.01); *H01Q 3/30* (2013.01); *H03K 17/6871* (2013.01); *H03F 3/20* (2013.01); *H03F 2200/294* (2013.01)

(58) Field of Classification Search
CPC .......... H04B 1/44; H04B 1/40; H04B 1/0458; H04B 1/04; H01Q 3/30; H03K 17/6871; H03H 3/0077; H03H 2003/0414
See application file for complete search history.

(56) References Cited

U.S. PATENT DOCUMENTS 6,118,985 A    9/2000  Kawakyu et al.
6,882,829 B2   4/2005  Mostov et al.
(Continued)

FOREIGN PATENT DOCUMENTS

CN   105379152 B   10/2017
GB    2376383 A   12/2002
(Continued)

OTHER PUBLICATIONS

Hettak et al., "High-power broadband GaN HEMT SPST/SPDT switches based on resonance inductors and shunt-stacked transistors" IEEE 2012, in 4 pages.

(Continued)

*Primary Examiner* — Tuan Pham
(74) *Attorney, Agent, or Firm* — Knobbe, Martens, Olson & Bear, LLP

(57) ABSTRACT

Radio frequency (RF) switches with controllable resonant frequency are provided herein. In certain embodiments, an RF switch includes a stack of two or more field-effect transistors (FETs) electrically connected between a first terminal and a second terminal. Additionally, the RF switch further includes an inductor connected between the first terminal and the second terminal and in parallel with the stack of FETs. A first portion of the FETs are controlled to turn on or off the RF switch. Additionally, a second portion of the FETs are controlled to provide tuning to a resonant frequency of the RF switch when the RF switch is turned off.

20 Claims, 9 Drawing Sheets

(51) Int. Cl.
*H03K 17/687* (2006.01)
*H03F 3/20* (2006.01)

(56) References Cited

U.S. PATENT DOCUMENTS

| | | |
|---|---|---|
| 8,575,991 B2 | 11/2013 | Kim et al. |
| 8,829,877 B2 | 9/2014 | Tseng et al. |
| 8,918,070 B2 | 12/2014 | Shanan |
| 9,024,700 B2 | 5/2015 | Ranta |
| 9,197,194 B2 | 11/2015 | Reedy et al. |
| 9,294,050 B2 | 3/2016 | Mostov et al. |
| 10,033,353 B2 * | 7/2018 | De Jongh ............... H03H 11/04 |
| 10,862,473 B2 * | 12/2020 | Ranta .................. H03K 17/6874 |
| 2013/0252562 A1 | 9/2013 | Hasson et al. |
| 2015/0214985 A1 * | 7/2015 | Lee ...................... H03H 7/1766 |
| | | 455/77 |
| 2017/0040996 A1 | 2/2017 | Zhao |
| 2019/0140687 A1 | 5/2019 | Tombak et al. |
| 2019/0214968 A1 | 7/2019 | Matsutani et al. |
| 2020/0343884 A1 | 10/2020 | Atesal et al. |

FOREIGN PATENT DOCUMENTS

| | | |
|---|---|---|
| JP | 2005027118 A | 1/2005 |
| JP | 2009540635 A | 11/2009 |

OTHER PUBLICATIONS

Yu et al., "A DC-50 GHz SPDT switch with maximum insertion loss of 1.9 dB in a commercial 0.13-μm SOI technology" IEEE 2015, in 2 pages.

\* cited by examiner

RADIO FREQUENCY SWITCHES WITH CONTROLLABLE RESONANT FREQUENCY

CROSS-REFERENCE TO RELATED APPLICATIONS

The present application claims priority to U.S. Provisional Patent Application No. 62/829,219, filed Apr. 4, 2019, and titled "RADIO FREQUENCY SWITCHES WITH CONTROLLABLE RESONANT FREQUENCY," the entirety of which is hereby incorporated herein by reference.

FIELD

Embodiments of the invention relate to electronic systems, and more particularly, to radio frequency switches.

BACKGROUND

A radio frequency (RF) communication system can include RF switches used for a variety of purposes.

In one example, an RF communication system can include a radio frequency transmit/receive switch. The transmit/receive switch can be used to electrically connect an antenna to a transmit path or a receive path of the system, thereby controlling access of the paths to the antenna.

SUMMARY OF THE DISCLOSURE

Radio frequency (RF) switches with controllable resonance frequency are provided herein. In certain embodiments, an RF switch includes a stack of two or more field-effect transistors (FETs) electrically connected between a first terminal and a second terminal. Additionally, the RF switch further includes an inductor connected between the first terminal and the second terminal and in parallel with the stack of FETs. A first portion of the FETs are controlled to turn on or off the RF switch. Additionally, a second portion of the FETs are controlled to provide tuning to a resonant frequency of the RF switch when the RF switch is turned off. For example, when the RF switch is in an OFF state, the RF switch has a resonant frequency that is based on a product of an inductance of the inductor and a capacitance of the stack of FETs. By controlling the gate voltages of the second portion of the FETs in the OFF state, the capacitance provided by the stack of FETs is changed. Thus, flexibility is provided for tuning the resonant frequency of the RF switch, for instance, to compensate for manufacturing variation and/or to control the resonant frequency based on operating frequency band to enhance isolation.

In one aspect, an RF switch with adjustable resonant frequency is provided. The RF switch includes a plurality of terminals including a first terminal and a second terminal, an inductor electrically connected between the first terminal and the second terminal, and a plurality of FETs electrically connected in series between the first terminal and the second terminal and in parallel with the inductor. A first portion of the plurality of FETs are controlled by a control signal to set the RF switch in an ON state or an OFF state, and a second portion of the plurality of FETs are separately controllable from the control signal to adjust a resonant frequency of the RF switch in the OFF state.

In another aspect, a method of RF switching is provided. The method includes propagating an RF signal through two or more FETs of an RF switch in an ON state of the RF switch, transitioning the switch from the ON state to an OFF state using a control signal that controls a first portion of the two or more FETs, and adjusting a resonant frequency of the RF switch in the OFF state using a second portion of the two or more FETs, the two or more FETs arranged in a stack that is in parallel with an inductor of the RF switch.

In another aspect, a front end system is provided. The front end system including an antenna terminal, a power amplifier, a low noise amplifier, and a transmit/receive switch including a receive branch electrically connected between an input to the low noise amplifier and the antenna terminal, and a transmit branch electrically connected between an output of the power amplifier and the antenna terminal. The receive branch includes a plurality of FETs arranged in series and an inductor in parallel with the plurality of FETs. A first portion of the plurality of FETs are controlled by a control signal to activate or deactivate the receive branch, and a second portion of the plurality of FETs are separately controllable from the control signal to adjust a resonant frequency of the receive branch when the receive branch is deactivated.

DETAILED DESCRIPTION OF EMBODIMENTS

Figure 1:
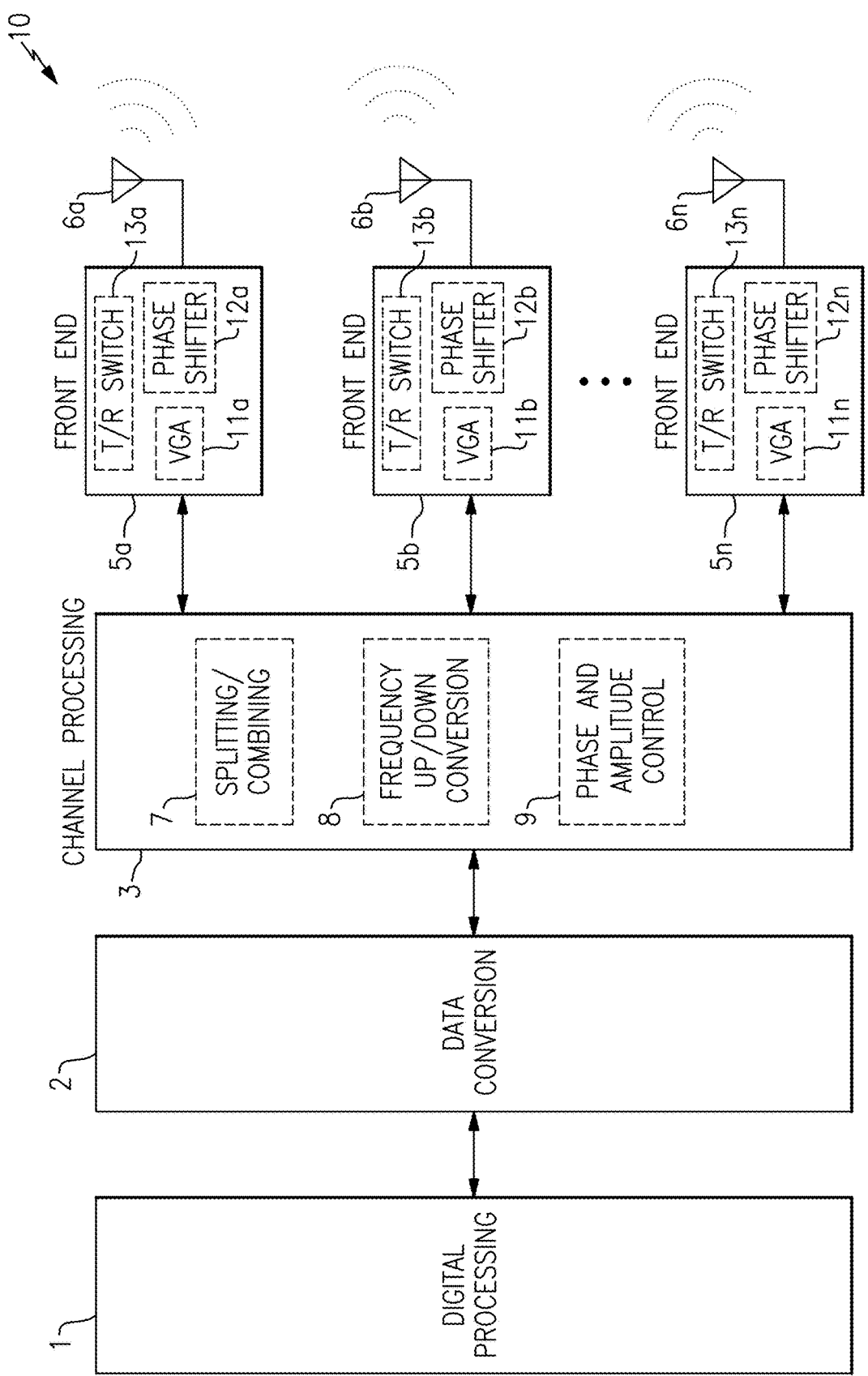
FIG. 1 is a schematic diagram of one embodiment of a phased array antenna system including transmit/receive (T/R) switches.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Radio frequency (RF) switches with controllable resonant frequency are provided herein. In certain embodiments, an RF switch includes a stack of two or more field-effect transistors (FETs) electrically connected between a first terminal and a second terminal. Additionally, the RF switch further includes an inductor connected between the first terminal and the second terminal and in parallel with the stack of FETs. A first portion of the FETs are controlled to turn on or off the RF switch. Additionally, a second portion of the FETs are controlled to provide tuning to a resonant frequency of the RF switch when the RF switch is turned off.

For example, when the RF switch is in an OFF state, the RF switch has a resonant frequency that is based on a product of an inductance of the inductor and a capacitance of the stack of FETs. By controlling the gate voltages of the second portion of the FETs in the OFF state, the capacitance provided by the stack of FETs is changed. Accordingly, the resonant frequency of the RF switch can be tuned.

The resonant frequency of the RF switch can be controlled for a variety of purposes. In certain implementations, the resonant frequency is controlled based on a frequency band of operation. For example, the resonant frequency can be adjusted to achieve multi-band operation with little to no impact on insertion loss. Additionally or alternatively, the resonant frequency can be controlled to compensate for process, voltage, and/or temperature (PVT) variation. For instance, the resonant frequency can be adjusted to overcome frequency shifts arising from process variation, thereby tuning back the desired center frequency of resonance and re-centering the design to account for process variation.

In certain implementations, the RF switch is implemented as a multi-throw switch including at least a first branch and a second branch, with the inductor in parallel with the stack of FETs in the first branch of the switch. For example, the RF switch can correspond to a transmit/receive (T/R) switch including a receive branch and a transmit branch.

Thus, when the first branch of the switch is OFF and the second branch of the switch is ON, the inductance and capacitance of the first branch act as a parallel inductor-capacitor (LC) resonator with a resonant frequency. Additionally, the resonant frequency can be tuned to achieve resonance at the frequency of interest (for instance, in a particular frequency band), which in turn provides high isolation. For example, the impedance of the parallel LC resonator can be very high at the resonant frequency, thereby serving as a notch filter for providing high isolation.

FIG. 1 is a schematic diagram of one embodiment of a phased array antenna system 10. The phased array antenna system 10 includes a digital processing circuit 1, a data conversion circuit 2, a channel processing circuit 3, RF front ends 5a, 5b, . . . 5n, and antennas 6a, 6b, . . . 6n. Although an example with three RF front ends and three antennas is illustrated, the phased array antenna system 10 can include more or fewer RF front ends and/or more or fewer antennas as indicated by the ellipses.

The phased array antenna system 10 illustrates one embodiment of an electronic system that can include one or more switches implemented in accordance with the teachings herein. However, the switches disclosed herein can be used in a wide range of electronics. A phased array antenna system is also referred to herein as an active scanned electronically steered array.

As shown in FIG. 1, the channel processing circuit 3 is coupled to antennas 6a, 6b, . . . 6n through RF front ends 5a, 5b, . . . 5n, respectively. The channel processing circuit 3 includes a splitting/combining circuit 7, a frequency up/down conversion circuit 8, and a phase and amplitude control circuit 9, in this embodiment. The channel processing circuit 3 provides RF signal processing of RF signals transmitted by and received from each communication channel. In the illustrated embodiment, each communication channel is associated with a corresponding RF front end and antenna.

With continuing reference to FIG. 1, the digital processing circuit 1 generates digital transmit data for controlling a transmit beam radiated from the antennas 6a, 6b, . . . 6n. The digital processing circuit 1 also processes digital receive data representing a receive beam. In certain implementations, the digital processing circuit 1 includes one or more baseband processors.

As shown in FIG. 1, the digital processing circuit 1 is coupled to the data conversion circuit 2, which includes digital-to-analog converter (DAC) circuitry for converting digital transmit data to one or more baseband transmit signals and analog-to-digital converter (ADC) circuitry for converting one or more baseband receive signals to digital receive data.

The frequency up/down conversion circuit 8 provides frequency upshifting from baseband to RF and frequency downshifting from RF to baseband, in this embodiment. However, other implementations are possible, such as configurations in which the phased array antenna system 10 operates in part at an intermediate frequency (IF). In certain implementations, the splitting/combining circuit 7 provides splitting to one or more frequency upshifted transmit signals to generate RF signals suitable for processing by the RF front ends 5a, 5b, . . . 5n and subsequent transmission on the antennas 6a, 6b, . . . 6n. Additionally, the splitting/combining circuit 7 combines RF signals received vias the antennas 6a, 6b, . . . 6n and RF front ends 5a, 5b, . . . 5n to generate one or more baseband receive signals for the data conversion circuit 2.

The channel processing circuit 3 also includes the phase and amplitude control circuit 9 for controlling beamforming operations. For example, the phase and amplitude control circuit 9 controls the amplitudes and phases of RF signals transmitted or received via the antennas 6a, 6b, . . . 6n to provide beamforming. With respect to signal transmission, the RF signal waves radiated from the antennas 6a, 6b, . . . 6n aggregate through constructive and destructive interference to collectively generate a transmit beam having a particular direction. With respect to signal reception, the channel processing circuit 3 generates a receive beam by combining the RF signals received from the antennas 6a, 6b, . . . 6n after amplitude scaling and phase shifting.

Phased array antenna systems are used in a wide variety of applications including, but not limited to, mobile communications, military and defense systems, and/or radar technology.

As shown in FIG. 1, the RF front ends 5a, 5b, . . . 5n each include one or more VGAs 11a, 11b, . . . 11n, which are used to scale the amplitude of RF signals transmitted or received by the antennas 6a, 6b, . . . 6n, respectively. Additionally, the RF front ends 5a, 5b, . . . 5n each include one or more phase shifters 12a, 12b, . . . 12n for phase-shifting the RF signals. For example, in certain implementations the phase and amplitude control circuit 9 generates gain control signals for controlling the amount of gain provided by the VGAs 11a, 11, . . . 11n and phase control signals for controlling the amount of phase shifting provided by the phase shifters 12a, 12b, . . . 12n. Furthermore, the RF front ends 5a, 5b, . . . 5n each include one or more T/R switches 13a, 13b, . . . 13n for selecting between transmit and receive signals such that the antennas 6a, 6b, . . . 6n are shared for transmit and receive operations, such as in applications employing time-division duplexing (TDD).

The phased array antenna system 10 operates to generate a transmit beam or receive beam including a main lobe pointed in a desired direction of communication. The phased array antenna system 10 realizes increased signal to noise (SNR) ratio in the direction of the main lobe. The transmit or receive beam also includes one or more side lobes, which point in different directions than the main lobe and are undesirable.

By implementing the T/R switches 13a, 13b, . . . 13n in accordance with the teachings herein, a number of benefits can be achieved, such as multi-band operation and/or enhanced isolation between transmit and receive paths. For example, when T/R switches 13a, 13b, . . . 13n provide RF transmit signals to the antennas 5a, 5b, . . . 5n to form a transmit beam, enhanced isolation is provided for the deactivated receive paths.

Figure 2A:
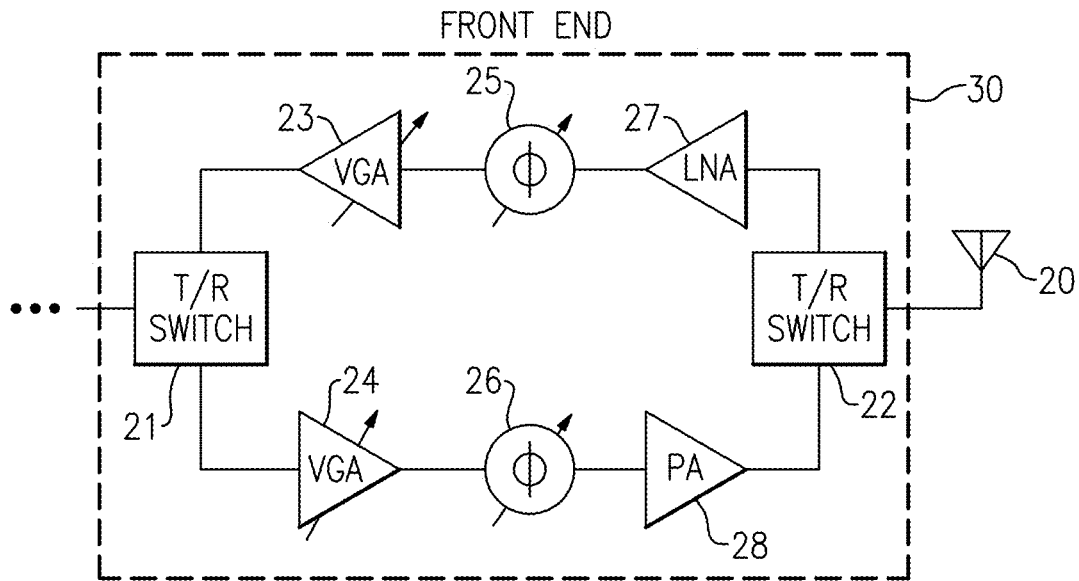
FIG. 2A is a schematic diagram of one embodiment of a front end system including T/R switches.

FIG. 2A is a schematic diagram of one embodiment of a front end system 30 including T/R switches. The front end system 30 includes a first T/R switch 21, a second T/R switch 22, a receive-path VGA 23, a transmit-path VGA 24, a receive-path controllable phase shifter 25, a transmit-path phase shifter 26, a low noise amplifier (LNA) 27, and a power amplifier (PA) 28. As shown in FIG. 2A, the front end system 30 is depicted as being coupled to the antenna 20.

The front end system 30 can be included in a wide variety of RF systems, including, but not limited to, phased array antenna systems, such as the phased array antenna system 10 of FIG. 1. For example, multiple instantiations of the front end system 30 can be used to implement the RF front ends 5a, 5b, . . . 5n of FIG. 1. In certain implementations, one or more instantiations of the front end system 30 are fabricated on a semiconductor die or chip.

As shown in FIG. 2A, the front end system 30 includes the receive-path VGA 23 for controlling an amount of amplification provided to an RF input signal received on the antenna 20, and the transmit-path VGA 24 for controlling an amount of amplification provided to an RF output signal transmitted on the antenna 20. The gain control provided by the VGAs can serve a wide variety of purposes including, but not limited to, compensating for temperature and/or process variation. Moreover, in beamforming applications, the VGAs can control side-lobe levels of a beam pattern.

RF systems, such as the front end system 30 of FIG. 2A, can include one or more T/R switches for controlling access of transmit and receive paths to an antenna. Although one example of an RF system including T/R switches is shown, the teachings herein are applicable to RF systems implemented in a wide variety of ways. Furthermore, the teachings herein are applicable not only to T/R switches, but also to RF switches serving other functions.

Figure 2B:
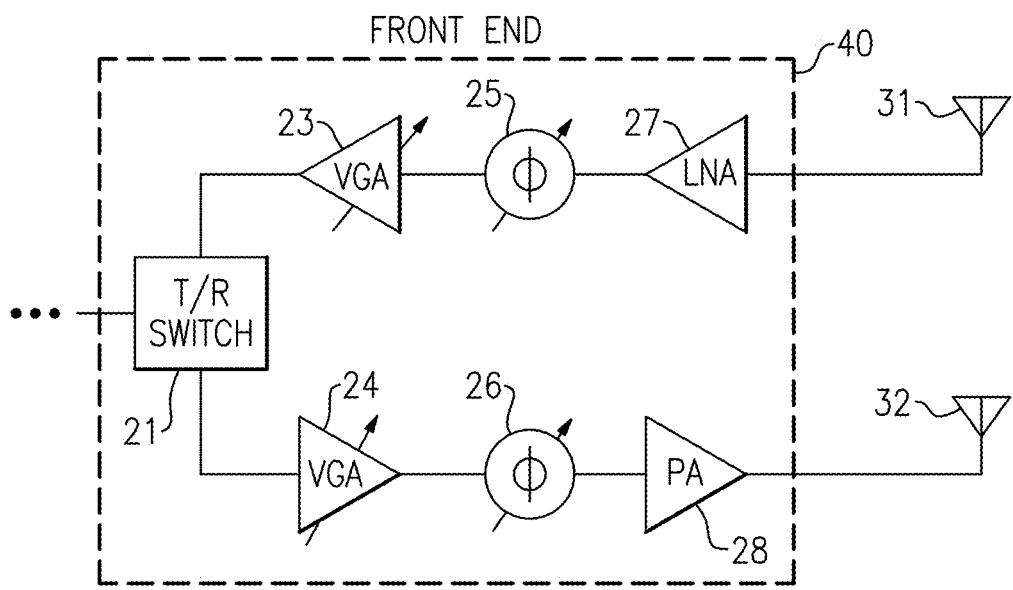
FIG. 2B is a schematic diagram of another embodiment of a front end system including T/R switches.

FIG. 2B is a schematic diagram of another embodiment of a front end system 40 including T/R switches. The front end system 40 of FIG. 2B is similar to the front end system 30 of FIG. 2A, except that the front end system 40 omits the second T/R switch 22. As shown in FIG. 2B, the front end system 40 is depicted as being coupled to a receive antenna 31 and to a transmit antenna 32.

The front end system 40 operates with different antennas for signal transmission and reception. In the illustrated embodiment, the receive-path VGA 23 controls an amount of amplification provided to an RF input signal received on the receive antenna 31, and the transmit-path VGA 24 controls an amount of amplification provided to an RF output signal transmitted on the second antenna 32.

Certain RF systems include separate antennas for transmission and reception of signals.

Figure 3:
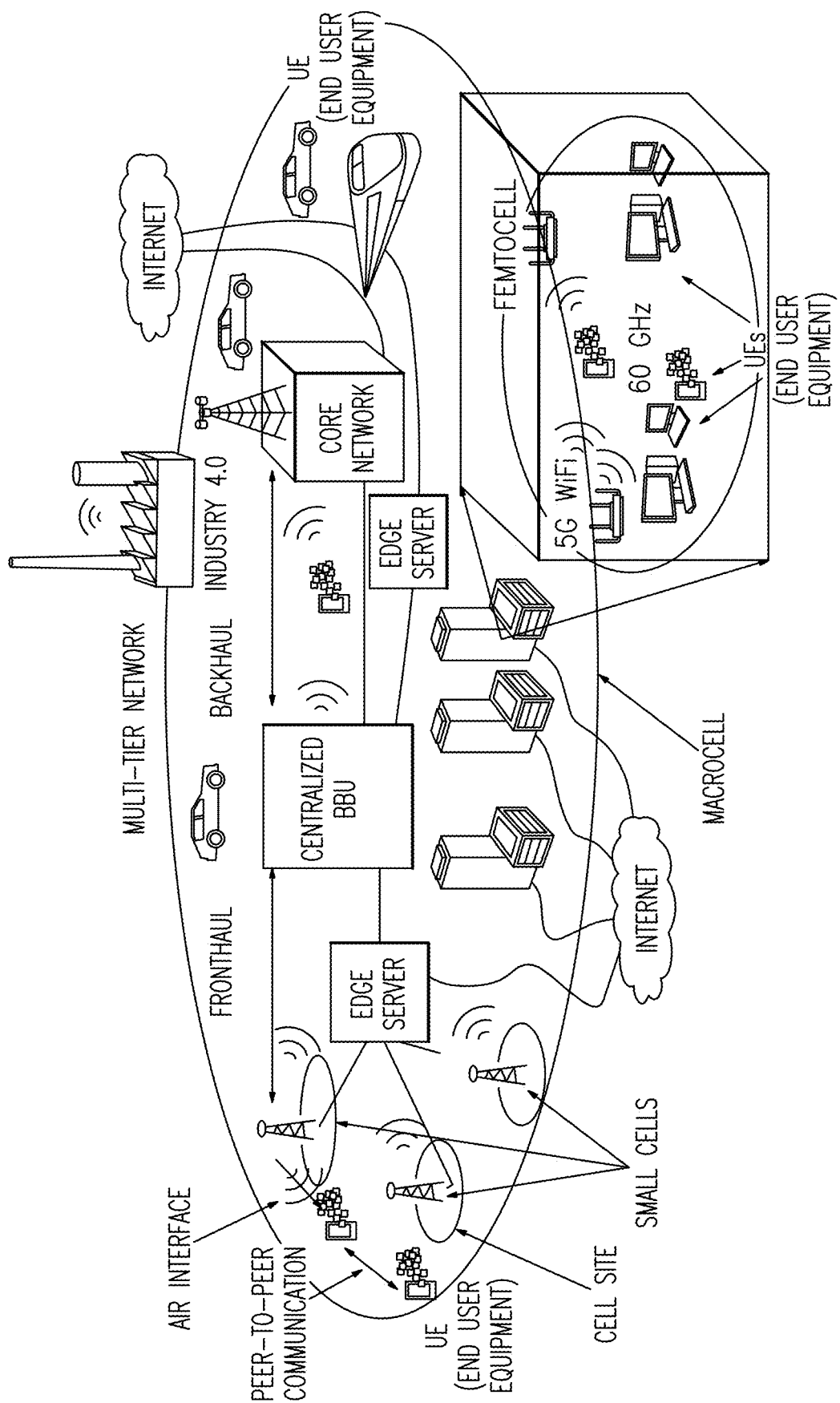
FIG. 3 is a schematic diagram of one example of a multi-tier high speed data communication network.

FIG. 3 is a schematic diagram of one example of a multi-tier high speed data communication network. The network can include, for instance, different mobile end users, industry 4.0 ecosystem support, and autonomous driving communication infrastructure. This supports artificial intelligence data communication and real time fast decision making process, as well as secure close-loop networks.

Wireless data traffic has been increasing at a rate of over 50% per year per subscriber, and this trend is expected to accelerate over the next decade with the continual use of video and the rise of IoT. To address this demand, 5G technology plans to use millimeter wave frequencies to expand available frequency spectrum and provide multi-Gigabit-per second (Gbps) data rates to mobile devices and other UE. 5G promises great flexibility to support a myriad of Internet Protocol (IP) devices, small cell architectures, and/or dense coverage areas.

Current or planned applications for 5G include, but are not limited to, Tactile Internet, vehicle-to-vehicle (V2V) communication, vehicle-to-infrastructure (V2I) communication, peer-to-peer communication, and/or machine-to-machine communication, close loop secured communication and external artificial intelligence data processing services on the cloud. Such technologies utilize high data rate and/or low network latency. For example, certain applications, such as V2V communication and/or remote surgery, must operate with low latency to ensure human safety.

In the multi-tier network of FIG. 3, existing cellular network is evolving to support 5G, where WiFi off-loading, small cells, and/or distribution of wideband data utilizes servers at the edges of the network (edge servers) to enable new use cases with lower latency. As shown in the example of FIG. 3, backhaul connects fixed cellular infrastructure to the core telephone network and the Internet. Thus, backhaul carries traffic between the local subnetwork (for instance, connections between UE and network access points, such as base stations) and the core network (for instance, the Internet and Mobile Switching Telephone Office). The multi-tier network of FIG. 3 is also implemented to operate using Industry 4.0, thereby enabling augmented reality and/or real-time artificial intelligence (AI) over the cloud.

With continuing reference to FIG. 3, the illustrated multi-tier architecture utilizes larger coverage fourth Generation (4G) cells with an underlying network of closer-spaced 5G base stations. Implementing the multi-tier network of FIG. 3 in this manner provides a number of advantages, including flexibility in providing different tiers of channel access priority for different kinds of connections. For example, macrocells, small cells, and/or device-to-device connections can operate with varying priorities for channel access.

One way to increase area spectral efficiency is to shrink cell size, thereby reducing the number of users per cell and provided additional spectrum to each user. Thus, total network capacity increases by shrinking cells and reusing spectrum.

The teachings herein can enhance performance of front end systems of base stations and UE operating in a multi-tier network. For example, flexibility can be provided to control the resonant frequency based on operating frequency band and/or to compensate for manufacturing variation, thereby enhancing isolation.

Figure 4:
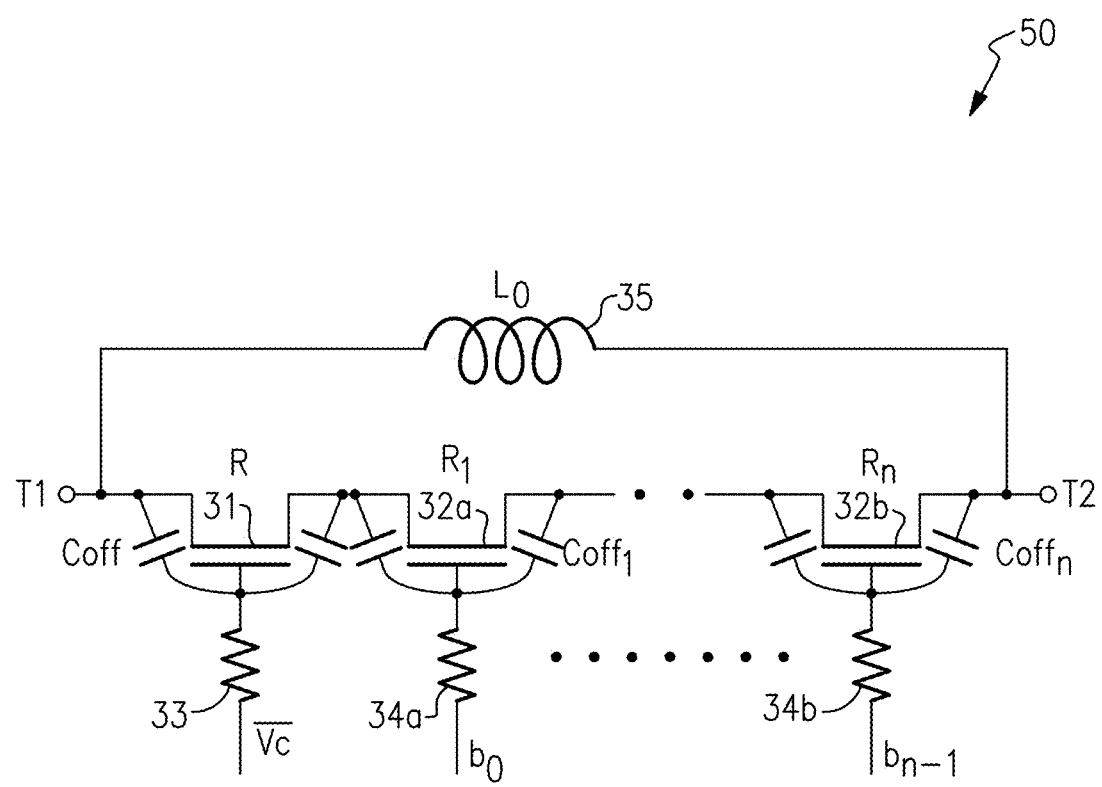
FIG. 4 is a schematic diagram of a radio frequency (RF) switch according to one embodiment.

FIG. 4 is a schematic diagram of an RF switch 50 according to one embodiment. The RF switch 50 includes multiple FETs (31, 32a, 32b, in this example) in series between a first terminal T1 and a second terminal T2. Additionally, the RF switch 50 further includes an inductor 35 connected between the first terminal T1 and the second terminal T2 and in parallel with the FETs. The inductor 35 has an inductance $L_0$, in this example.

A first portion or group of the FETs (including FET 31, in this example) are controlled to turn on or off the RF switch 50. For instance, a control signal $\overline{VC}$ (which is logically inverted, in this example) is used to turn on or off the FET 31 to thereby control the RF switch 50 to an ON state or an OFF state. Although an example with one FET being used to turn on or off the RF switch is shown, additional FETs can be used to turn on or off the RF switch. For example, one or more additional FETs can be placed in series with the FET 31 to enhance the power handling capability of the RF switch 50.

With continuing reference to FIG. 4, a second portion or group of the FETs (including FET 32a and FET 32b, in this example) are controlled to adjust a resonant frequency of the RF switch 50. For example, a bit $b_0$ controls the FET 32a, while a bit $b_{n-1}$ controls the FET 32b. Although an example with two FETs being used for resonant frequency adjustment is shown, more or fewer FETs can be used for controlling the resonant frequency of the RF switch 50.

When the RF switch 50 is in the OFF state, the RF switch 50 has a resonant frequency that is based on a product of an inductance of the inductor 50 (corresponding to $L_0$, in this example) and a capacitance of the stack of FETs present between the first terminal T1 and the second terminal T2.

By controlling the gate voltages of the second portion of the FETs (corresponding to FET 32a and FET 32b, in this example) in the OFF state, the capacitance is changed. Accordingly, the resonant frequency of the RF switch 50 can be tuned.

For example, when the control signal $\overline{VC}$ turns off the FET 31 to operate the RF switch 50 in the OFF state, the gate-to-source capacitance and gate-to-drain capacitance of the FET 31 (both equal to about Coff, in this example) are in series between the first terminal T1 and the second terminal T2 and contribute to the capacitance of the RF switch 50.

Additionally, when the bit $b_0$ turns off the FET 32a, the gate-to-source capacitance and gate-to-drain capacitance of the FET 32a (both equal to about $Coff_1$, in this example) contribute to the capacitance of the RF switch 50. However, when the bit $b_0$ turns on the FET 32a, a conductive channel is provided through the FET 32a thereby bypassing the gate-to-source and gate-to-drain capacitances of the FET 32a which increases the total capacitance of the RF switch 50. Likewise, when bit $b_{n-1}$ turns off the FET 32b, the gate-to-source capacitance and gate-to-drain capacitance (both equal to about $Coff_n$, in this example) contribute to the capacitance of the RF switch 50. However, when the bit $b_{n-1}$ turns on the FET 32b, a conductive channel is provided through the FET 32b to bypass these capacitances.

Accordingly, the bit $b_0$ and the bit $b_{n-1}$ providing flexibility for controlling a capacitance of the RF switch 50 in the OFF state, and a corresponding frequency of resonance. Although depicted as two bits, more or fewer bits can be used for resonant frequency adjustment. Furthermore, the teachings herein are applicable not only to multi-bit digital signals for resonant frequency adjustment, but also to other types of resonant frequency adjustment signals.

In the illustrated embodiment, gate resistors are also included to enhance isolation between the RF switch 50 and a control circuit (for instance, the control circuit 101 of FIG. 9B) used to generate control signals for the RF switch 50. As shown in FIG. 4, the gate resistor 33 is used to provide the control signal $\overline{VC}$ to the gate of the FET 31. Additionally, the gate resistor 34a is used to provide bit $b_0$ to the gate of the FET 32a, while the gate resistor 34b is used to provide $b_{n-1}$ to the gate of the FET 32b.

When the RF switch 50 is turned on, the switch's insertion loss is based on the resistances of the FETs between the first terminal T1 and the second terminal T2. In this example, the FET 31 has an on-state resistance R, while the FET 32a has an on-state resistance $R_1$ and the FET 32b has an on-state resistance $R_n$. The number of FETs in series can be selected based on a variety of factors, such as a desired power handling capability and/or insertion loss of the RF switch 50. The FETs in the second group used for resonant frequency adjustment also aid in enhancing a power handling capability of the RF switch 50 in the ON state.

The FETs can be implemented in a wide variety of ways, including, but not limited to, using metal-oxide-semiconductor (MOS) transistors, such as n-type MOS (NMOS) transistors and/or p-type MOS (PMOS) transistors. In one example, the MOS transistors are fabricated using a silicon-on-insulator (SOI) process.

Figure 5:
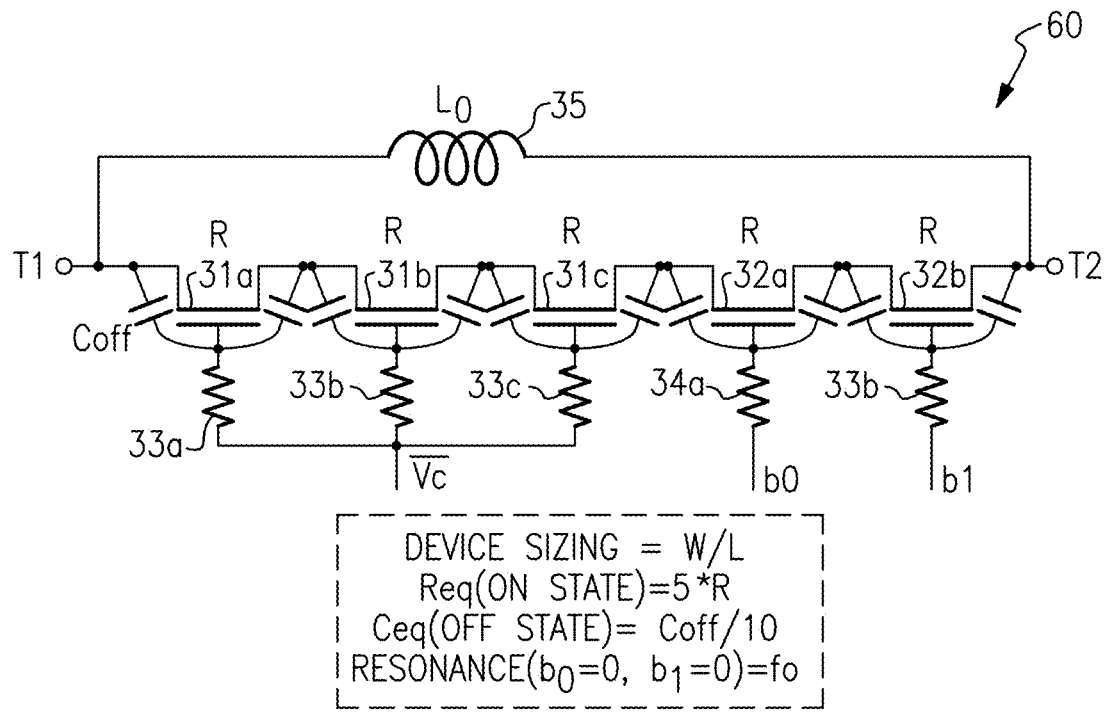
FIG. 5 is a schematic diagram of an RF switch according to another embodiment.

FIG. 5 is a schematic diagram of an RF switch 60 according to another embodiment. The RF switch 60 includes an inductor 35 in parallel with a stack of FETs. The FET 31a, the FET 31b, and the FET 31c are part of a first group of the stack and are controlled by a control signal $\overline{VC}$ for turning on or off the RF switch 60. Additionally, the FET 32a and the FET 32b are part of a second group of the stack and are controlled by bit b0 and bit b1, respectively.

Although the stack of FETs includes five transistors in this embodiment, more or fewer transistors can be included in the stack. For example, the first group and/or the second group can include more or fewer transistors. For instance, the number of transistors in the stack can be selected based on a wide variety of factors, such as desired power handling capability, desired on-state insertion loss, operating frequencies or bands, and/or desired range of resonant frequency tuning.

The first group of FETs serve to turn on or off the RF switch 60. Additionally, the second group of FETs serve to provide controllability to the resonant frequency of the RF switch 60 when the RF switch 60 is turned off.

In the illustrated embodiment, each of the FETs in the stack has a width W and a length L, and a corresponding on-state resistance R. Although an example in which the FETs have about the same geometry is depicted, the FETs can be implemented with different geometries from one another. In one example, the FETs in the second group have different weights according to any desired weighting scheme. Implementing the FETs of the second group with weighting aids in providing a wide tuning range of the resonant frequency.

When all of the FETs in the stack are turned off, the equivalent off capacitance Ceq is about Coff/10, where Coff corresponds to the off-state gate-to-source/gate-to-drain capacitance of each FET. The resonant frequency for this setting corresponds to about $f_0$ and is associated with b0=0 and b1=0, in this example. By controlling b0=1 and/or b1=1, the off-state capacitance can be reduced to change the resonant frequency of the RF switch 60.

When incorporated into a branch of a multi-throw switch (for instance, a receive branch of a T/R switch), the equivalent off capacitance Ceq is controllable by turning on some or all of the series FETs in the second group (independently of the FETs in the first group) while another branch (for instance, a transmit branch of the T/R switch) is ON. This in turn changes equivalent off capacitance Ceq and leads to a shift in the resonant frequency of the parallel LC resonator associated with the inductance of the inductor 35 and the capacitance of the stack of FETs.

Figure 6:
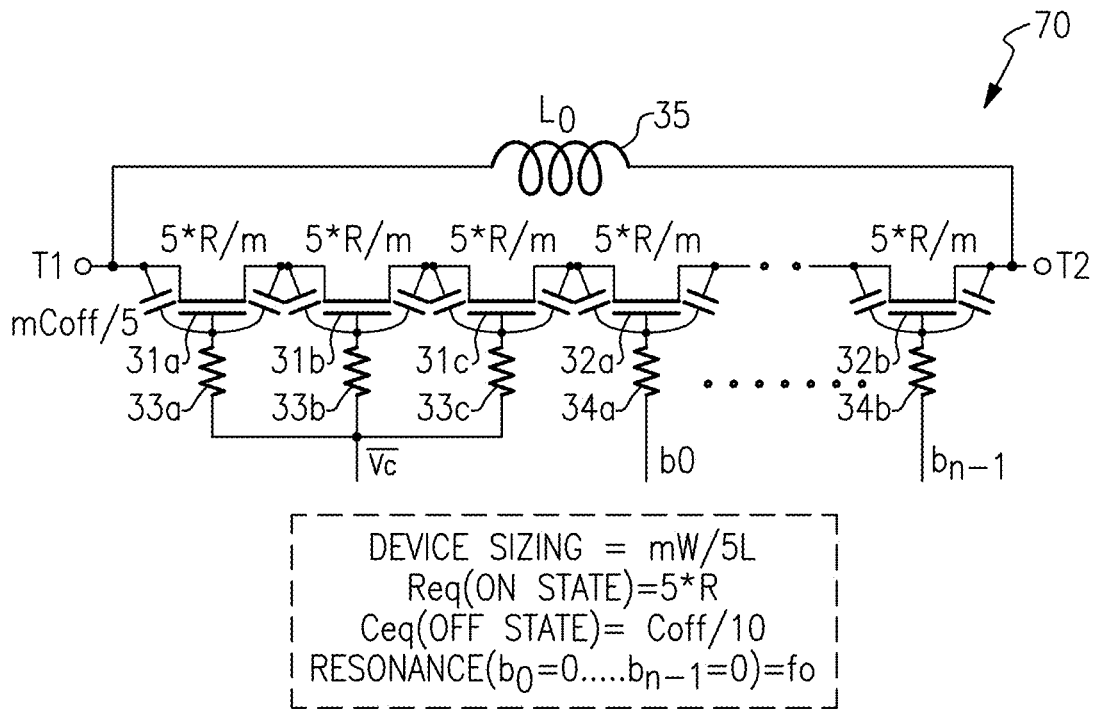
FIG. 6 is a schematic diagram of an RF switch according to another embodiment.

FIG. 6 is a schematic diagram of an RF switch 70 according to another embodiment. The RF switch 70 includes an inductor 35 in parallel with multiple FETs, including a first group (FET 31a, FET 31b, and FET 31c) controlled by a control signal $\overline{VC}$ and a second group (FET 32a and FET 32b) controlled by a bit b0 and a bit $b_{n-1}$, respectively.

Although five FETs are depicted, any integer m FETs can be included in the RF switch 60. In certain embodiments, n FETs are in the second group and m-n of the FETs are in the first group, where m is greater than or equal to 2, n is greater than or equal to 1, and m is greater than n.

Figure 7A:
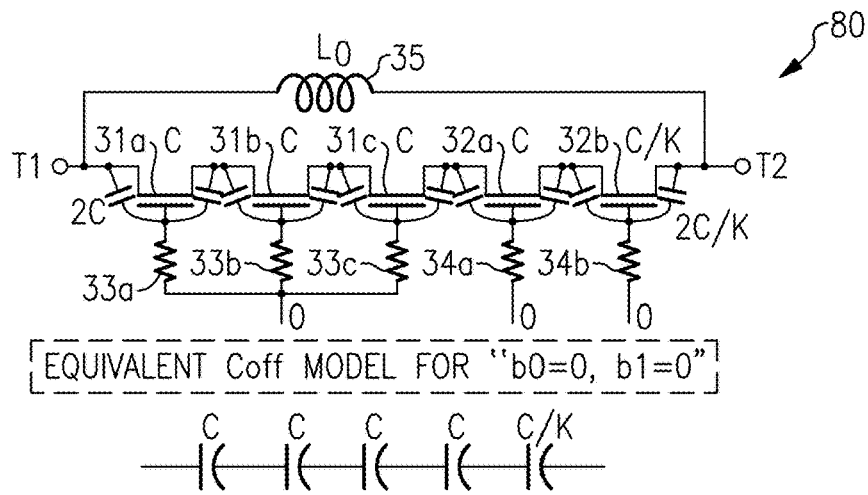
FIG. 7A is a schematic diagram of a first resonant frequency adjustment setting of an RF switch according to another embodiment.

FIG. 7A is a schematic diagram of an RF switch 80 according to another embodiment. The RF switch 80 includes a first group of FETs including a FET 31a, a FET 31b, and a FET 31c. Additionally, the RF switch 80 includes a second group of FETs including a FET 32a and a FET 32b. The first group of FETs and the second group of FETs are in series with one another between the first terminal T1 and the second terminal T2. Additionally, the inductor 35 is in parallel with the series combination of FETs.

The FET 32b is sized with a scaling factor K relative to the rest of the FETs in the stack.

A first resonant frequency adjustment setting of the RF switch 80 is depicted in FIG. 7A, in which the FET 32a and the FET 32b are both turned off. In this example, a gate-to-source capacitance ($C_{GS}$) and a gate-to-drain capacitance transistor ($C_{GD}$) of the FET 32b each equal 2C/K, while $C_{GS}$ and $C_{GD}$ of the other FETs each equal 2C. Thus, the equivalent off capacitance Ceq1 for the first resonant frequency adjustment setting corresponds to C/(K+4), in this example.

Figure 7B:
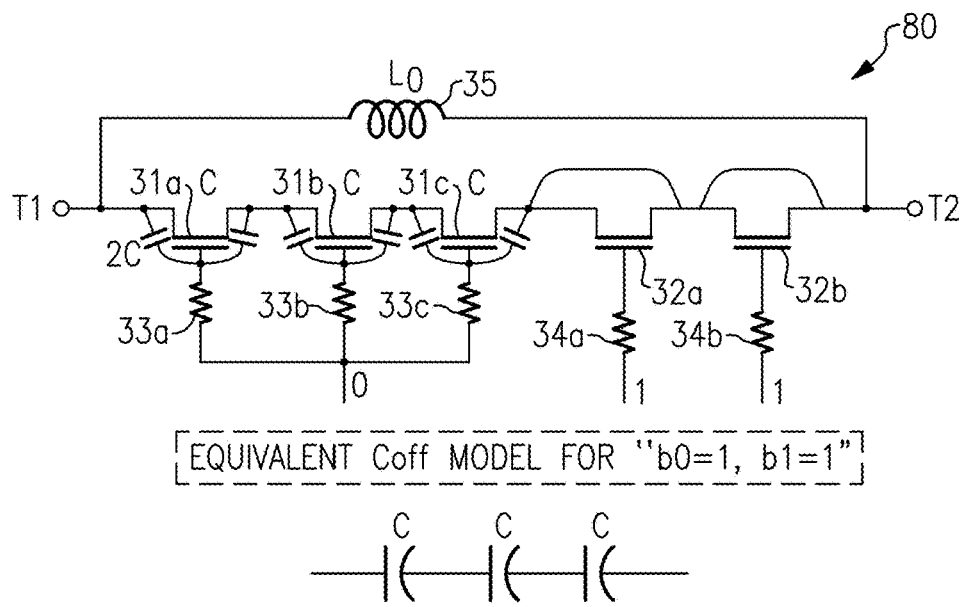
FIG. 7B is a schematic diagram of a second resonant frequency adjustment setting of the RF switch of FIG. 7A.

FIG. 7B is a schematic diagram of a second resonant frequency adjustment setting of the RF switch 80 of FIG. 7A.

As shown in FIG. 7B, the FET 32a and the FET 32b are turned in the second resonant frequency adjustment setting. The equivalent off capacitance Ceq2 for the second setting corresponds to C/3.

In one embodiment, the value K is selected for a dual frequency band response of the RF switch 80. For example, for a frequency $f_1$=39 GHz (for instance, a first 5G band) and a frequency $f_2$=28 GHz (for instance, a second 5G band), K can be selected to satisfy equation 1 below:

$$\frac{f2}{f1} = \sqrt{\frac{Ceq1}{Ceq2}} = \frac{28 \text{ GHz}}{39 \text{ GHz}}$$

For n=2 control bits/control FETs and m=5 total FETs, the capacitance ratio for achieving both bands 28 GHz/39 GHz for 5G is satisfied for K of about 1.82 (corresponding to 0.55 W/L for FET 32b relative to the other FETs).

Figure 8:
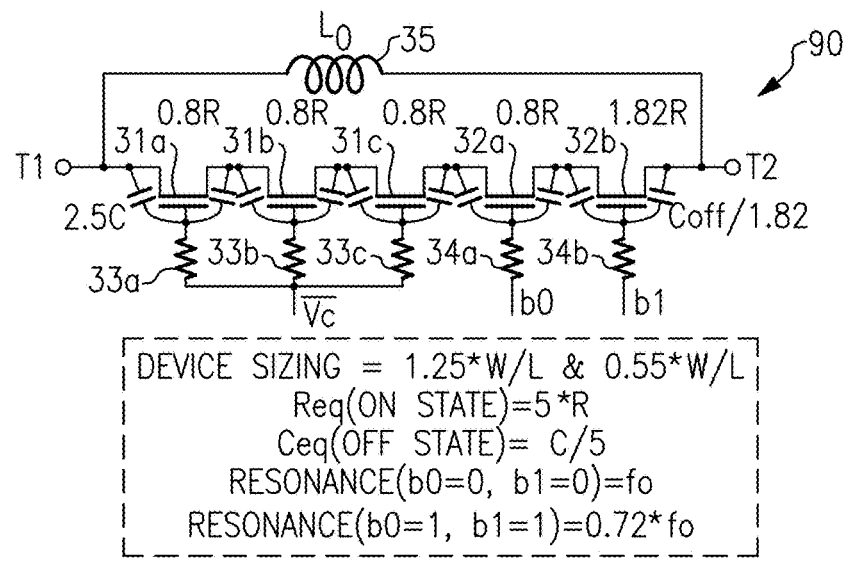
FIG. 8 is a schematic diagram of an RF switch according to another embodiment.

FIG. 8 is a schematic diagram of an RF switch 90 according to another embodiment. The RF switch 90 of FIG. 8 is similar to the RF switch 80 of FIGS. 7A and 7B, except that the RF switch 90 corresponds to an example in which the device sizing of the FET 32b is about 0.55*W/L (corresponding to K=1.82) and the device sizing of the remaining FETs in the stack is about 1.25*W/L.

To achieve an Ron*Coff ratio desired for a particular application, the device sizing can be selected to achieve resonance at the frequency bands of interest with little to no impact on ON state operation and/or increase in path loss.

In the example of FIG. 8, the two FETs in the second group of FETs are turned on and off separately with b0 and b1 control bits, thereby providing four resonant frequency adjustment settings. In this example, a setting of b0=b1=0 provides a resonant frequency f0, while a setting of b0=b1=1 provides a resonant frequency of about 0.72*f0.

Figure 9A:
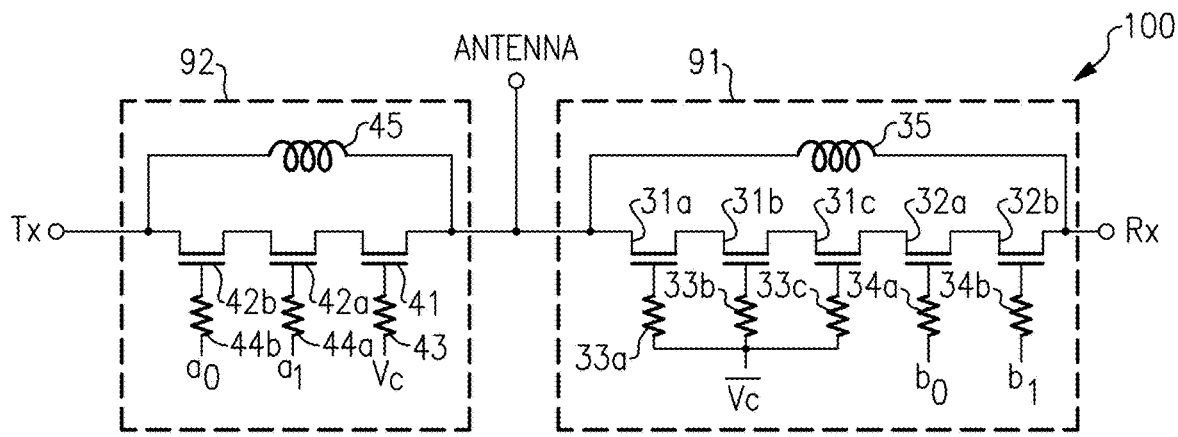
FIG. 9A is a schematic diagram of a T/R switch according to one embodiment.

FIG. 9A is a schematic diagram of a T/R switch 100 according to one embodiment. The T/R switch 100 includes a receive branch 91 and a transmit branch 92. The receive branch 91 is connected between a receive terminal Rx and an antenna terminal, while the transmit branch 92 is connected between a transmit terminal Tx and the antenna terminal.

The receive branch 91 includes an inductor 35 in parallel with a stack of receive branch FETs. The receive branch FETs include a first group (FET 31a, FET 31b, and FET 31c) controlled by a control signal $\overline{VC}$ and a second group of FETs (FET 32a and FET 32b) controlled by bit $b_0$ and bit $b_1$. Additionally, gate resistors 33a, 33b, and 33c are included for FETs 31a, 31b, and 31c, respectively, and gate resistors 34a and 34b are included for FETs 32a and 32b, respectively.

The transmit branch 92 includes an inductor 45 in parallel with a stack of transmit branch FETs. The transmit branch FETs include a first group (FET 41) controlled by a control signal VC and a second group of FETs (FET 42a and FET 42b) controlled by bit $a_0$ and bit $a_1$. Additionally, a gate resistor 43 is included for FET 41, and gate resistors 44a and 44b are included for FETs 42a and 42b, respectively.

The receive branch 91 and transmit branch 92 are controlled by logically inverted control signals, in this example. Thus, the receive branch 91 is turned off when the transmit branch 92 is active. Furthermore, the transmit branch 92 is turned off when the receive branch 91 is active.

In the illustrated embodiment, both the receive branch 91 and the transmit branch 92 are implemented with adjustable resonant frequencies in accordance with the teachings herein. For example, control bits a0 and a1 can be used switch the receive bands, while control bits b0 and b1 can be used to switch the transmit bands.

Although illustrated for the case of a transmit/receive switch, the teachings herein are applicable to any suitable RF switch.

Figure 9B:
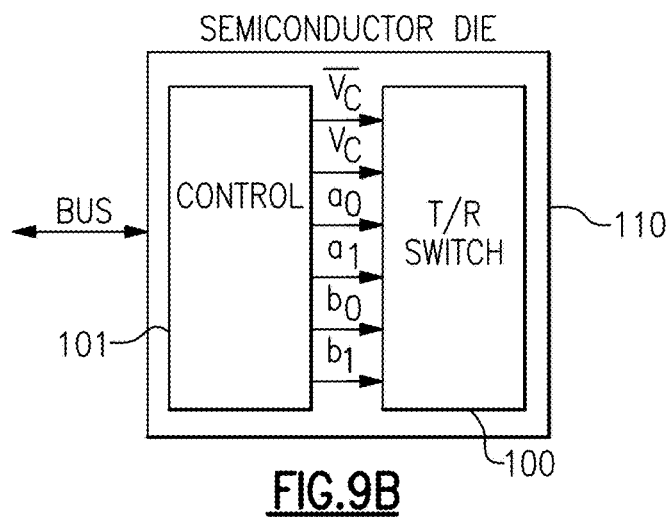
FIG. 9B is a schematic diagram of one embodiment of a semiconductor die including the T/R switch of FIG. 9A.

FIG. 9B is a schematic diagram of one embodiment of a semiconductor die 110. The semiconductor die 110 includes the T/R switch 100 of FIG. 9A. Additionally, the semiconductor die 110 further includes a control circuit 101 connected to a chip interface or bus. The control circuit 101 generates the control signals for the T/R switch 100 based on data received over the bus.

Although one embodiment of circuitry suitable for controlling an RF switch is shown, the RF switches herein can be controlled in other ways.

FIGS. 10A-10D are simulation results for one example implementation of the T/R switch 100 of FIG. 9A in which the receive branch 91 and the transmit branch 92 are implemented for 5G dual band operation at 28 GHz and 39 GHz.

Figure 10A:
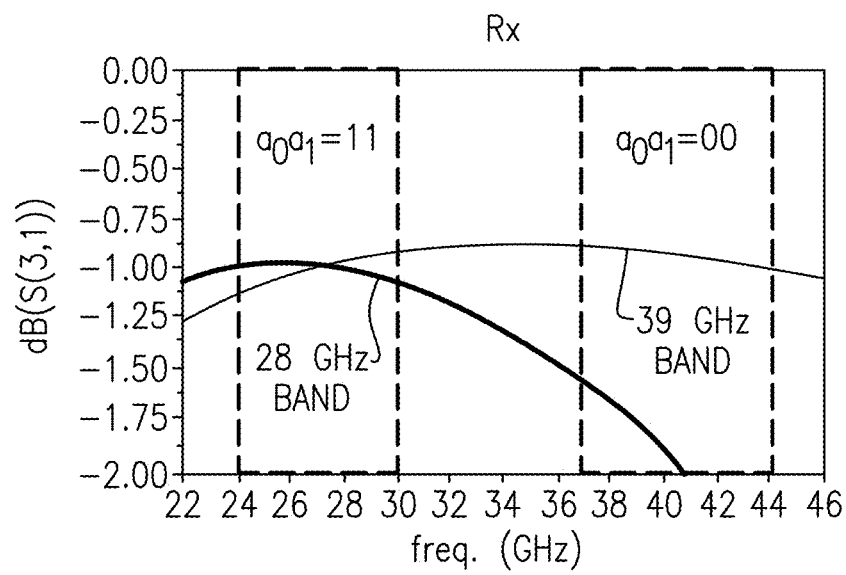
FIG. 10A is one example of a graph of loss versus frequency for the receive branch of the T/R switch of FIG. 9A.

FIG. 10A is one example of a graph of loss versus frequency for the receive branch 91 of the T/R switch 100 of FIG. 9A.

Figure 10B:
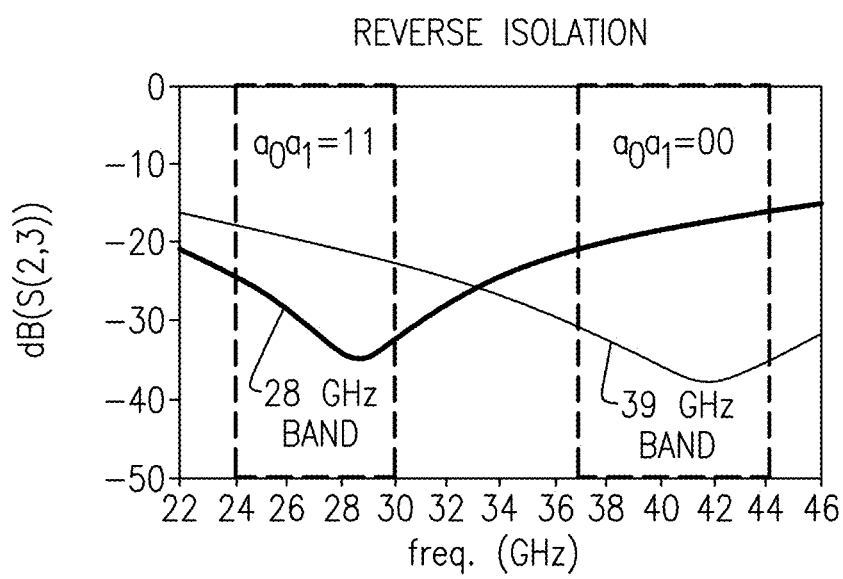
FIG. 10B is one example of a graph of reverse isolation versus frequency for the receive branch of the T/R switch of FIG. 9A.

FIG. 10B is one example of a graph of reverse isolation versus frequency for the receive branch 91 of the T/R switch 100 of FIG. 9A.

Figure 10C:
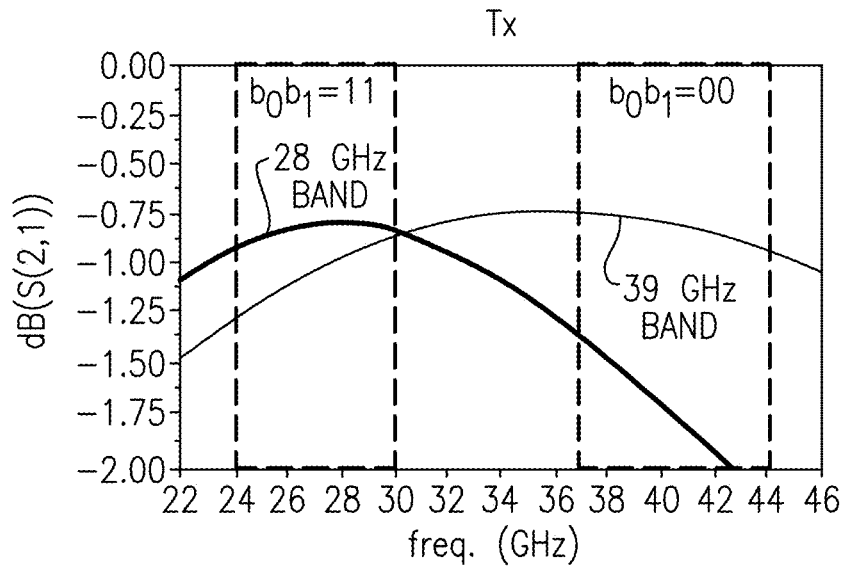
FIG. 10C is one example of a graph of loss versus frequency for the transmit branch of the T/R switch of FIG. 9A.

FIG. 10C is one example of a graph of loss versus frequency for the transmit branch 92 of the T/R switch 100 of FIG. 9A.

Figure 10D:
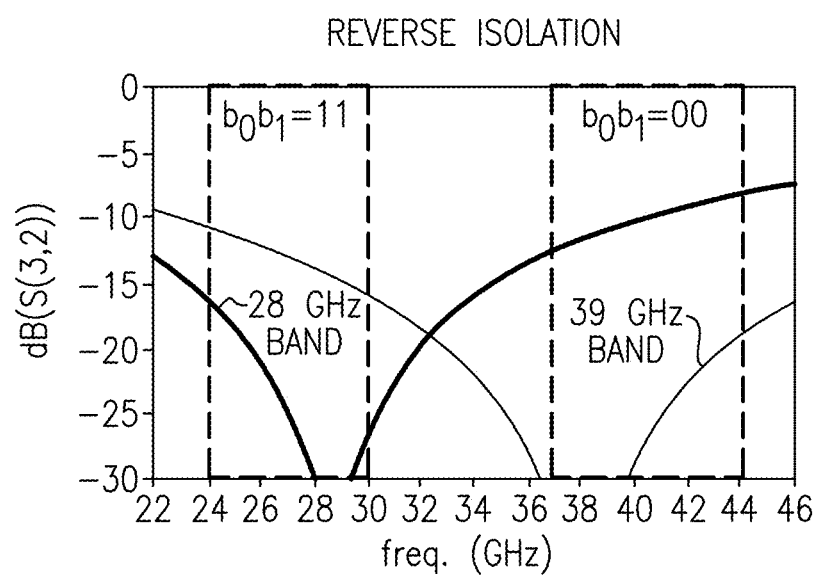
FIG. 10D is one example of a graph of reverse isolation versus frequency for the transmit branch of the T/R switch of FIG. 9A.

FIG. 10D is one example of a graph of reverse isolation versus frequency for the transmit branch 92 of the T/R switch 100 of FIG. 9A.

Although various examples of performance results have been shown, simulation or measurement results can vary based on a wide variety of factors, such as simulation models, simulation tools, simulation parameters, measurement conditions, fabrication technology, and/or implementation details. Accordingly, other results are possible.

APPLICATIONS

Devices employing the above described schemes can be implemented into various electronic devices. Examples of electronic devices include, but are not limited to, RF communication systems, consumer electronic products, electronic test equipment, communication infrastructure, etc. For instance, one or more RF switches can be included in a wide range of communication systems, including, but not limited to, radar systems, base stations, mobile devices (for instance, smartphones or handsets), phased array antenna systems, laptop computers, tablets, and wearable electronics.

The teachings herein are applicable to RF communication systems operating over a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

The signals handled by the RF switches herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A radio frequency (RF) switch with adjustable resonant frequency, the RF switch comprising:
   a plurality of terminals including a first terminal and a second terminal;
   an inductor electrically connected between the first terminal and the second terminal; and
   a plurality of field-effect transistors (FETs) electrically connected in series between the first terminal and the second terminal and in parallel with the inductor, wherein a first portion of the plurality of FETs are controlled by a control signal to set the RF switch in an ON state or an OFF state, and wherein a second portion of the plurality of FETs are separately controllable from the control signal to adjust a resonant frequency of the RF switch in the OFF state.

2. The RF switch of claim 1 wherein at least one FET of the second portion has a different size from at least one FET of the first portion.

3. The RF switch of claim 1 wherein the first portion includes at least two FETs.

4. The RF switch of claim 1 wherein the second portion includes at least two FETs of different sizes.

5. The RF switch of claim 1 wherein the second portion of FETs is controllable by a plurality of digital bits.

6. The RF switch of claim 5 wherein the plurality of digital bits are generated based on data received over a bus.

7. The RF switch of claim 5 wherein a value of the plurality of digital bits controls a frequency band of operation.

8. The RF switch of claim 5 wherein a value of the plurality of digital bits compensates for process variation.

9. The RF switch of claim 1 further comprising a receive branch and a transmit branch, wherein the inductor and the plurality of FETs are included in the receive branch.

10. The RF switch of claim 1 further comprising a receive branch and a transmit branch, wherein the inductor and the plurality of FETs are included in the transmit branch.

11. A method of radio frequency (RF) switching, the method comprising:

propagating an RF signal through two or more field-effect transistors (FETs) of an RF switch in an ON state of the RF switch;
transitioning the switch from the ON state to an OFF state using a control signal that controls a first portion of the two or more FETs; and
adjusting a resonant frequency of the RF switch in the OFF state using a second portion of the two or more FETs, the two or more FETs arranged in a stack that is in parallel with an inductor of the RF switch.

12. The method of claim 11 wherein the first portion includes at least two FETs.

13. The method of claim 11 wherein the second portion includes at least two FETs.

14. The method of claim 13 further comprising controlling the second portion of FETs using a plurality of digital bits.

15. The method of claim 14 further comprising receiving data over a bus, and setting a value of the plurality of digital bits based on the data.

16. The method of claim 14 further comprising setting a value of the plurality of digital bits to select a frequency band of operation.

17. The method of claim 14 further comprising setting a value of the plurality of digital bits to compensate for process variation.

18. A front end system comprising:
an antenna terminal;
a power amplifier;
a low noise amplifier; and
a transmit/receive switch including a receive branch electrically connected between an input to the low noise amplifier and the antenna terminal, and a transmit branch electrically connected between an output of the power amplifier and the antenna terminal, wherein the receive branch includes a plurality of field-effect transistors (FETs) arranged in series and an inductor in parallel with the plurality of FETs, wherein a first portion of the plurality of FETs are controlled by a control signal to activate or deactivate the receive branch, and wherein a second portion of the plurality of FETs are separately controllable from the control signal to adjust a resonant frequency of the receive branch when the receive branch is deactivated.

19. The front end system of claim 18 wherein the second portion of FETs are controllable by a plurality of digital bits.

20. The front end system of claim 18 implemented in a phased array antenna system.

* * * * *